United States Patent
O'Coimin et al.

(10) Patent No.: US 8,701,821 B2
(45) Date of Patent: Apr. 22, 2014

(54) ACOUSTIC DAMPENING SLEEVE FOR ELECTRONIC EQUIPMENT AND METHOD OF MAKING THE SAME

(76) Inventors: David O'Coimin, Bristol (GB); Tim Walsh, Marlow (GB); Stephen Fitton, Reading (GB)

( * ) Notice: Subject to any disclaimer, the term of this patent is extended or adjusted under 35 U.S.C. 154(b) by 0 days.

(21) Appl. No.: 13/073,098

(22) Filed: Mar. 28, 2011

(65) Prior Publication Data

US 2011/0284316 A1 Nov. 24, 2011

Related U.S. Application Data

(60) Provisional application No. 61/318,440, filed on Mar. 29, 2010.

(51) Int. Cl.
*E04F 17/04* (2006.01)
*F01N 99/00* (2010.01)

(52) U.S. Cl.
USPC .......................................... 181/224; 181/225

(58) Field of Classification Search
USPC ................. 181/198, 201, 202, 205, 224, 225
See application file for complete search history.

(56) References Cited

U.S. PATENT DOCUMENTS

| | | | | |
|---|---|---|---|---|
| 2,759,556 A | * | 8/1956 | Baruch | 181/203 |
| 4,146,112 A | * | 3/1979 | Usry | 181/202 |
| 4,316,522 A | * | 2/1982 | Hirschorn | 181/224 |
| 6,164,369 A | * | 12/2000 | Stoller | 165/104.33 |
| 6,481,527 B1 | | 11/2002 | French et al. | |
| 6,643,130 B1 | * | 11/2003 | DeMarchis et al. | 361/695 |
| 7,379,298 B2 | * | 5/2008 | Walsh et al. | 361/692 |
| 7,762,373 B2 | * | 7/2010 | Bolton et al. | 181/225 |
| 2004/0099477 A1 | * | 5/2004 | Abom et al. | 181/286 |
| 2006/0104027 A1 | | 5/2006 | Vinson et al. | |
| 2006/0202045 A1 | | 9/2006 | Liu | |
| 2008/0106864 A1 | * | 5/2008 | Merino | 361/688 |
| 2008/0230305 A1 | * | 9/2008 | Goto et al. | 181/224 |
| 2008/0257639 A1 | * | 10/2008 | Yamaguchi et al. | 181/198 |
| 2009/0201640 A1 | | 8/2009 | Bard et al. | |
| 2009/0268391 A1 | * | 10/2009 | Matsushima et al. | 361/679.49 |
| 2010/0018798 A1 | * | 1/2010 | Jeon et al. | 181/225 |

FOREIGN PATENT DOCUMENTS

WO WO-2009153601 A1 12/2009

OTHER PUBLICATIONS

International Search Report and Written Opinion for International Application No. PCT/IB2011/001112 mailed Oct. 6, 2011. 11 pages.

* cited by examiner

*Primary Examiner* — Jeremy Luks

(57) ABSTRACT

An acoustic dampening sleeve for electronic equipment and a method of making the same is disclosed. An enclosure for abating noise generated therein includes a housing having a structure defining an internal chamber that has ventilation openings for the ingress and egress of cooling air. The structure cooperates with equipment disposed therein to define intake and exhaust plenums. Air outside the structure passes through the housing ingress opening, into the intake plenum, through the equipment, into the exhaust plenum, and exits the structure through the housing egress opening. The ingress and/or egress openings include baffles. The baffles comprise a resilient material defining openings in fluid communication with the internal chamber and a space outside the housing. The baffles are disposed to prevent or reduce a line of sight between the inside of the structure and the outside of the structure while maintaining open vent channels between the baffles.

19 Claims, 12 Drawing Sheets

ACOUSTIC DAMPENING SLEEVE FOR ELECTRONIC EQUIPMENT AND METHOD OF MAKING THE SAME

CROSS-REFERENCE TO RELATED APPLICATIONS

This application claims the benefit of U.S. Provisional Application No. 61/318,440, entitled Acoustic Dampening Sleeve for Electronic Equipment and Method of Making the Same, filed Mar. 29, 2010, incorporated by reference herein.

BACKGROUND OF THE INVENTION

1. Field of Invention

The present invention relates to enclosures for electronics equipment. More particularly, the present invention relates to enclosures for electronic equipment that have the capability to ventilate the electronic equipment contained in the enclosure and reduce noise emanating from the enclosure.

2. Description of Related Art

The amount of electronic equipment found in the office and home has increased dramatically in recent years. For example, in an office environment, the use of server computers is commonplace. Likewise, high-speed Internet access is becoming increasingly available, adding to the amount of electronic equipment in use in the office environment, e.g. T1 or T3 connectivity equipment, ADSL or cable modems, Ethernet routers, and Wi-Fi access points.

As the speed and power of today's computer and electronic equipment has increased, so has the amount of "noise" and heat produced by such equipment. This is in part due to the physical size of the various devices becoming smaller and smaller which further complicates cooling the computer and electronic equipment. This is realized by there being less surface area available for heat exchange. This means that there must be increased airflow through the equipment casing to effect cooling. The amount of noise also is increased because the cooling equipment is more powerful, to provide greater capacity, and such cooling equipment also generates more noise.

There have been attempts to decrease noise by placing equipment in sealed enclosures. However, this attempt to trap noise also trapped heat in the sealed enclosure that was generated by the equipment. The inability to remove the trapped heat has induced equipment failure. To combat this, modern enclosures have been vented in an attempt to provide adequate airflow to the equipment. Venting the enclosure allows much of the noise created by computers and electronic equipment to escape the enclosure.

A perceived solution to the noise problem was to provide a dedicated electronic equipment room, e.g., a dedicated server room. These rooms are very often sealed and provided with a separate air conditioning system to remove the heat created by the equipment and maintain a temperature for safe operation of the equipment. Depending on the amount of equipment and size of the room, they can also include noise abatement measures. However, there are a number of drawbacks to this solution. Providing a dedicated electronic equipment room is expensive and often requires valuable office space to be sacrificed. In addition, although noise levels can be reduced outside the dedicated equipment room, the noise level in the dedicated equipment room can be quite high. This can create an unpleasant, and sometimes harmful, environment for those who must work on or with the electronic equipment.

Moreover, a dedicated server room may be prohibitively expensive for relatively smaller sites that do not have a large amount of computing equipment. For example, the use of "all-in-one" server systems, such as a blade system, enable organizations with minimal server needs to install the server capacity that is required at a particular moment in time and scale-up or scale-down as needed. A blade system typically includes a blade enclosure and one or more blade servers installed therein.

In contrast to a conventional server, a blade server may lack typical server components, e.g., a hard drive, a power supply, network connections, and/or human interface hardware. Instead, these components reside in the server enclosure and can be shared by any of the blade servers installed in the enclosure. In this way, the bulk and power consumption of the entire system is decreased. This permits a multi-server installation to exist in a relative small footprint (e.g., ~300 mm high×~500 mm wide×~1000 mm long), which, in turn, allows the blade system to reside within an open office environment.

However, as mentioned above, concentrating multiple server computers into this relatively small footprint requires adequate cooling of the equipment in the blade system. Fan units mounted within the blade enclosure that draw air through the blade server component typically provide such cooling. Thus, the blade systems can emit a considerable amount of noise, which can lead to many of the problems set forth above.

Similar problems with noise were encountered in the home environment. As the amount of audio and video equipment in the home increases, so does the level of noise produced by the need to cool such equipment. For example, a common home theater system often includes one or more of the following items: a cable signal converter box, a satellite video tuner, a video cassette recorder (VCR), digital video recorder (DVR), a digital video disc (DVD) player, an audio tuner/amplifier system, and/or a media PC. Many people find this vast collection of electronic equipment unsightly.

To alleviate the problem, many home theater owners sought to hide the electronic equipment inside of enclosures or furniture. These owners encounter similar problems with heat and noise as do offices. Some home theater equipment is cooled by natural convection rather than forcing air through the equipment casing with cooling fans. When equipment is placed in an enclosure, heat is trapped, which can lead to equipment failure or a reduction of equipment life.

There is a need for a system and method that provides better noise and heat reduction for electronic equipment. The present invention overcomes the problems of the past by providing a novel system and method as set forth in the remainder of this specification referring to the attached drawings.

BRIEF SUMMARY OF THE INVENTION

The present invention is directed to an acoustic dampening sleeve for electronic equipment and a method of making the same. An embodiment of the present invention includes a housing for abating noise generated from within the housing. The housing includes a housing structure defining an internal chamber that has ventilation openings for the ingress and egress of cooling air. The housing structure cooperates with electronic equipment disposed therein to define an intake plenum and an exhaust plenum within the internal chamber. Air outside the housing structure passes through the ingress opening in the housing structure, into the intake plenum, through the electronic equipment, into the exhaust plenum, and exits the housing structure through the egress opening in the housing structure. At least one of the ingress opening and egress opening includes a baffle structure comprising a plurality of baffles. The baffles comprise a resilient material defining a plurality of openings in fluid communication with the internal chamber and a space outside the housing structure. The baffles are disposed to prevent a line of sight between the inside of the housing structure and the outside of the housing structure while maintaining open vent channels between the baffles.

In another aspect of the invention, each of the baffles comprises an elongate member of resilient noise-abating material having a substantially flat profile in a relaxed state that is maintained in a deformed state having a curved profile.

In still a further aspect of the invention, the housing structure includes a divider disposed in the internal chamber that cooperates with the electronic equipment therein to define the intake plenum and exhaust plenum.

In yet another aspect of the invention, the housing structure comprises a top wall, a first side wall, a second side wall, and a bottom wall. At least one of said walls has a noise-abating material disposed thereon.

In an aspect of the invention, the dampening sleeve also includes a cable egress port that includes a port structure and a removable cover. The port structure is adapted to be received at a port opening in the enclosure housing. The port structure includes an open back and top, and a removable cover. The removable cover is capable of being fixed to the port structure to accommodate a plurality of different sized cables. Noise-abating material is disposed inside the port structure and on the internal surface of the removable cover such that when the cover is fixed to the port structure the noise-abating material disposed on the internal surface of the removable cover mates with the noise-abating material inside the port structure to substantially seal at least one cable passing through the port structure into the housing structure such that noise emanating from the housing structure is abated from exiting through the port structure.

In another aspect of the invention, the dampening sleeve includes an intake chamber defined by a plurality of walls, at least one of said walls having noise-abating material disposed thereon. The intake chamber has an air intake and an air outlet, the air intake is in fluid communication with a space outside the housing structure and the air outlet is in fluid communication with the ingress opening.

In still another aspect of the invention, the dampening sleeve includes an exhaust chamber defined by a plurality of walls, at least one of said walls having noise-abating material disposed thereon. The exhaust chamber has an air intake and an air outlet, the air intake is in fluid communication with the egress opening and the air outlet is in fluid communication with a space outside the housing structure.

The present invention will now be described in greater detail in the remainder of the specification referring to the attached drawings.

These and other aspects of the present invention will be described in detail in the remainder of the specification, claims, and attached drawings.

BRIEF DESCRIPTION OF THE SEVERAL VIEWS OF THE INVENTION

Figure 4A:
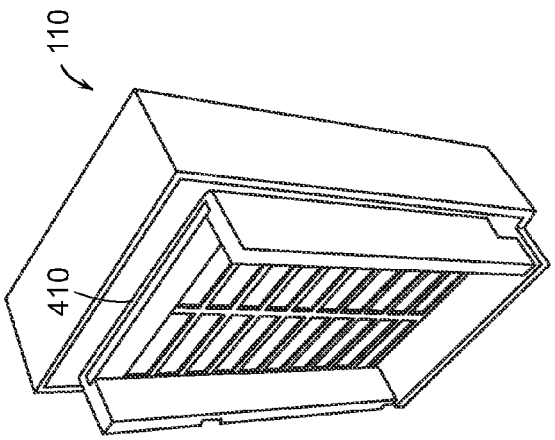
Figure 4B:
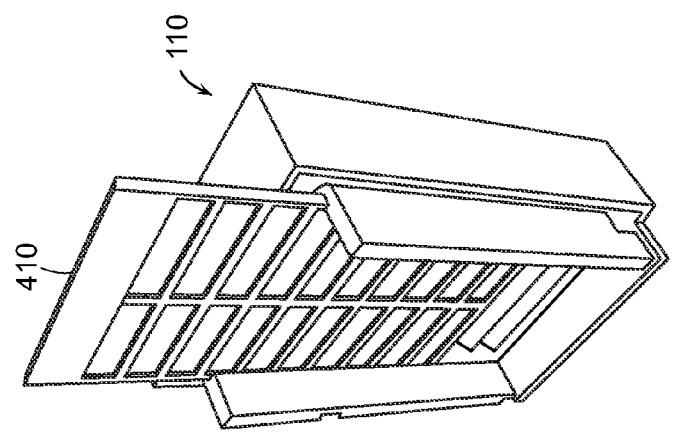
Figure 4C:
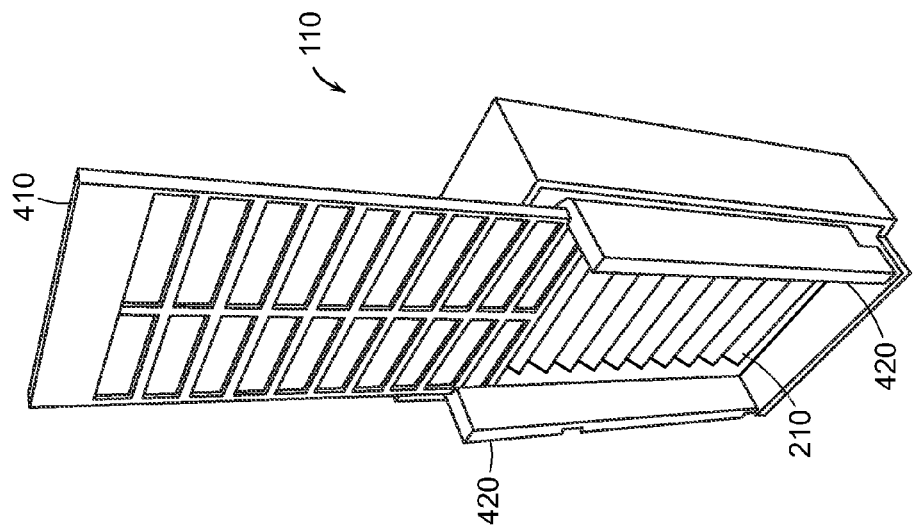

FIGS. 4A-C show a series of perspective views of an intake baffle assembly with an optional filtering device in accordance with an embodiment of the present invention.

Figure 5:
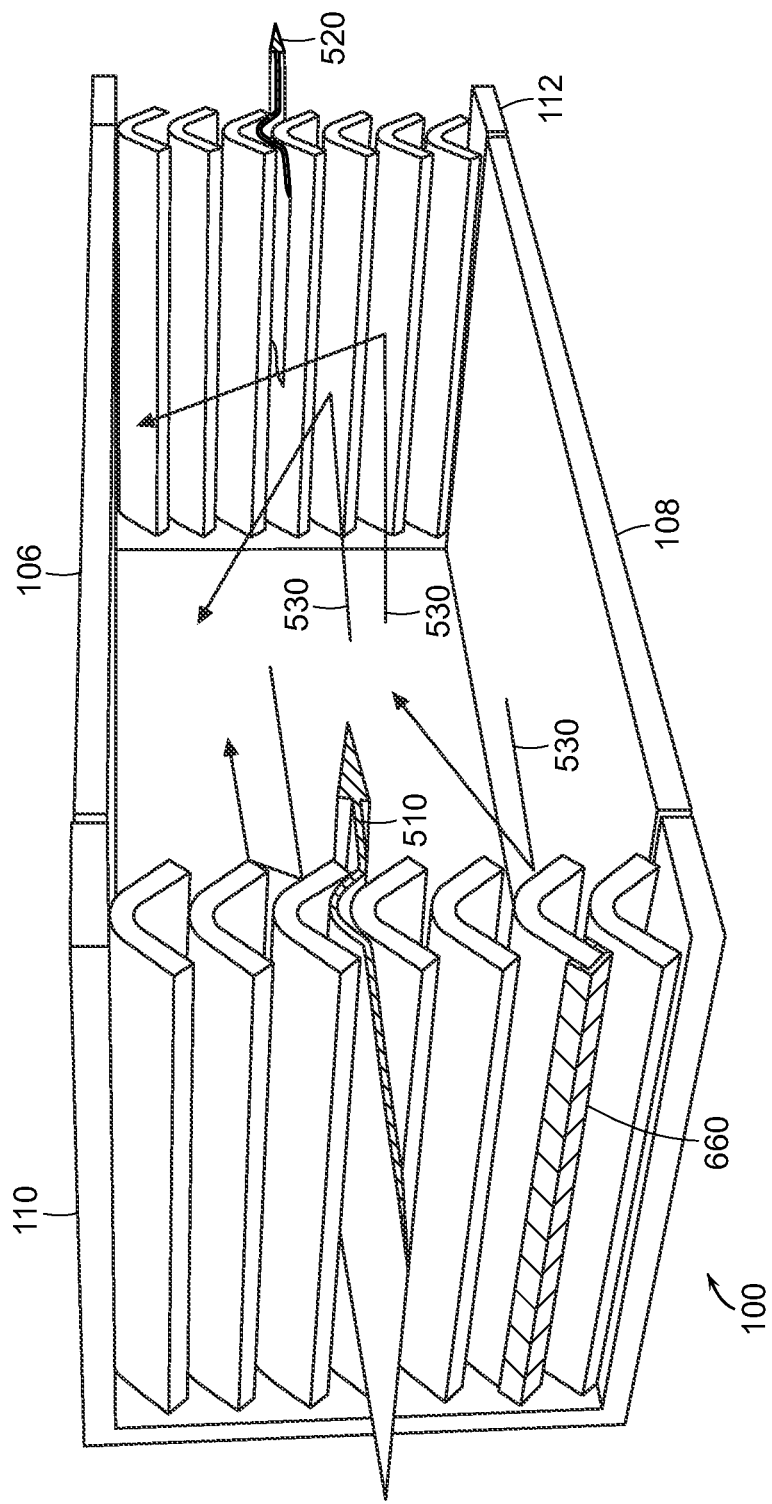

FIG. 5 shows a cut-away perspective view of the main body of an enclosure in accordance with an embodiment of the present invention.

Figure 6B:
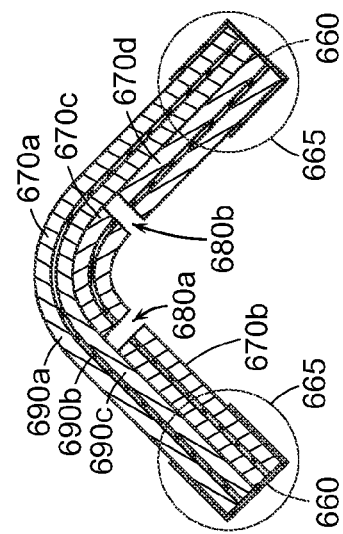
Figure 6A:
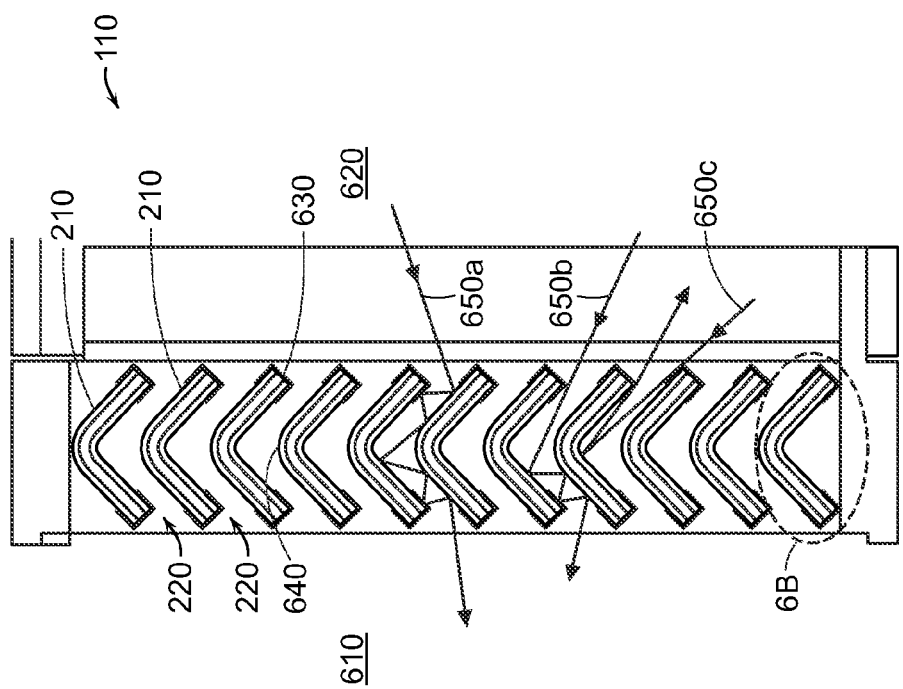

FIG. 6A shows a cross-sectional side view of an intake baffle assembly in accordance with an embodiment of the present invention.

FIG. 6B shows a cross-sectional side view a baffle in accordance with an embodiment of the present invention.

Figure 7:
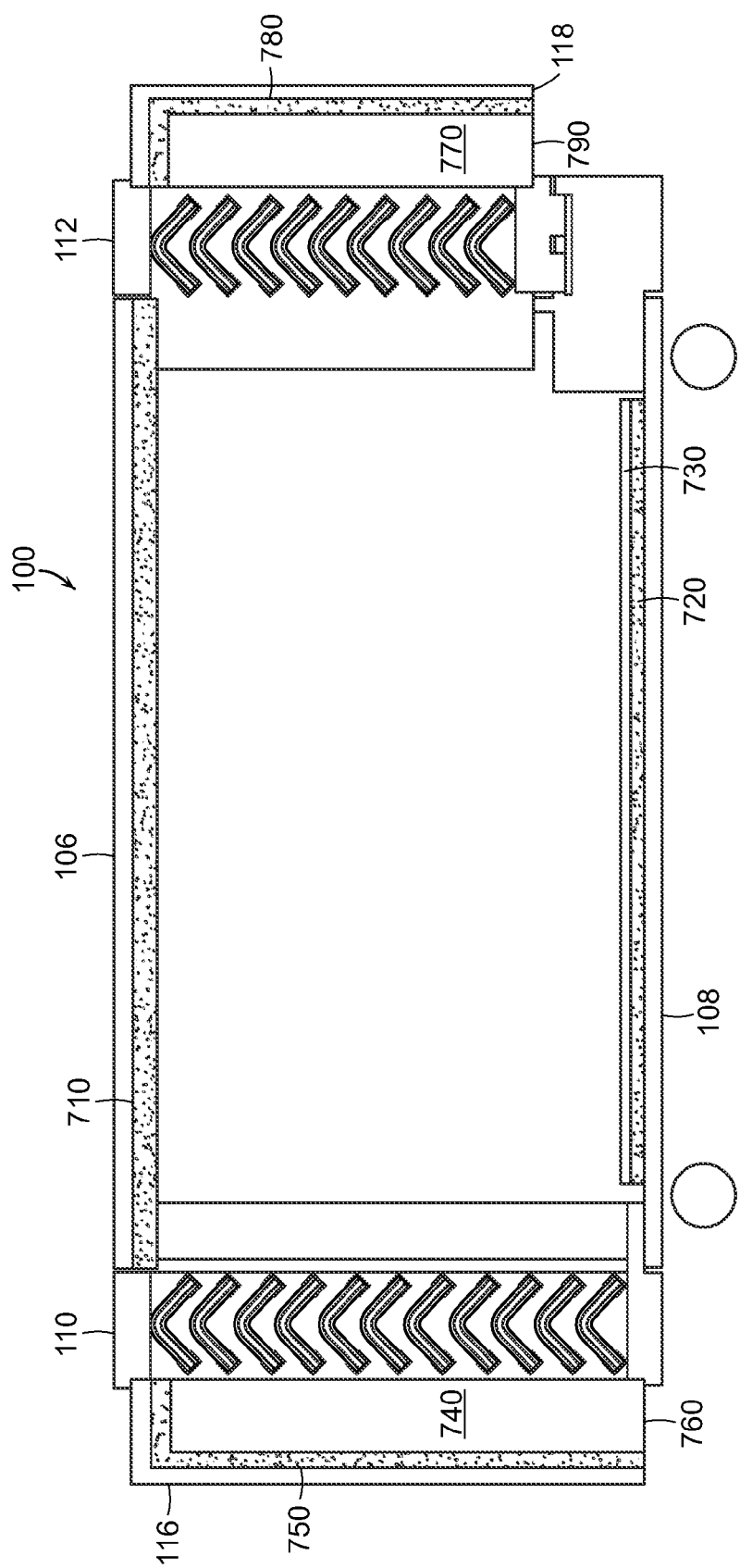

FIG. 7 shows a cut-away side view of an enclosure in accordance with an embodiment of the present invention.

Figure 8A:
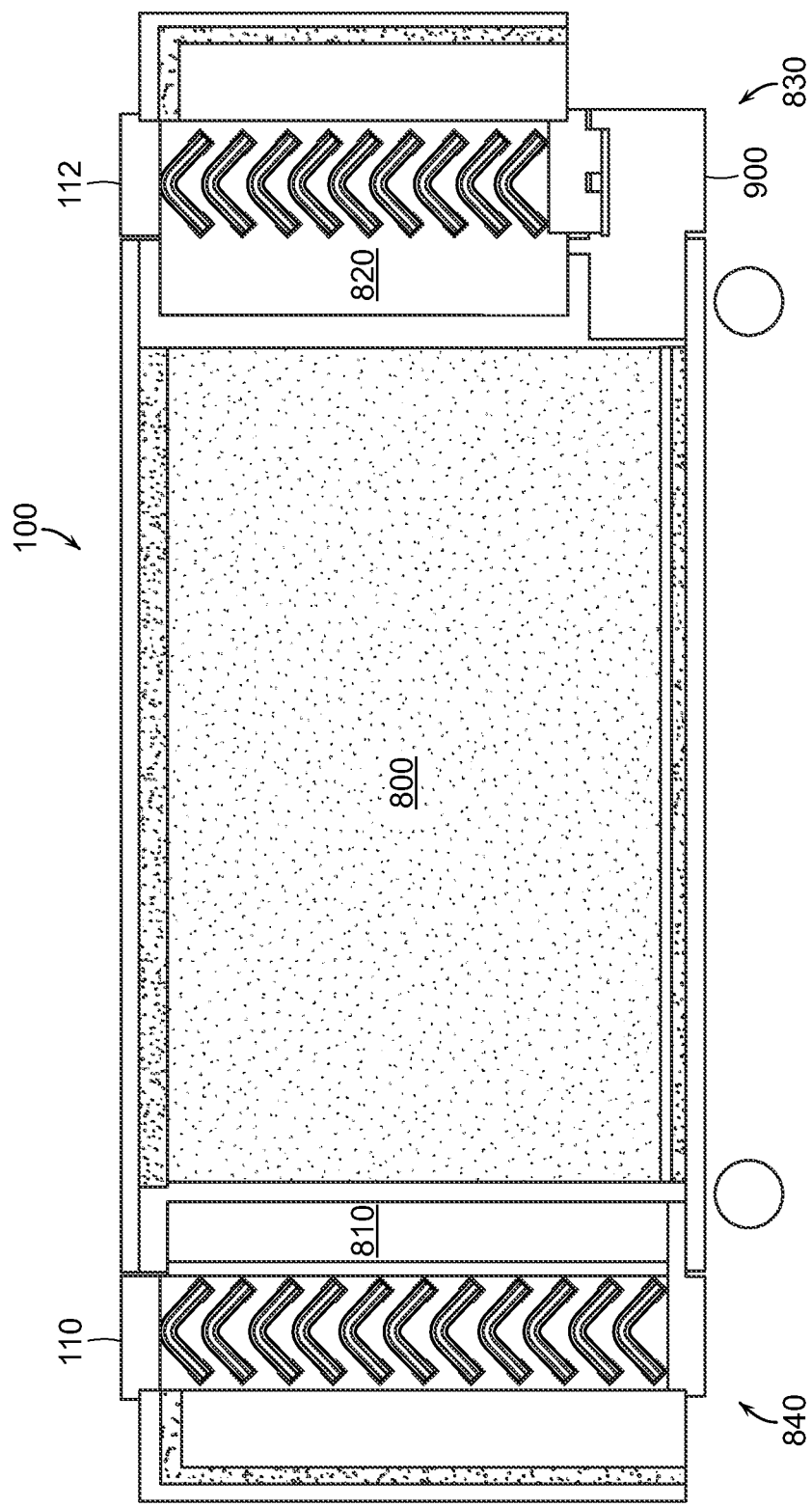

FIG. 8A shows the cut-away side view of FIG. 7 with electronic equipment installed in the enclosure in accordance with an embodiment of the present invention.

Figure 8B:
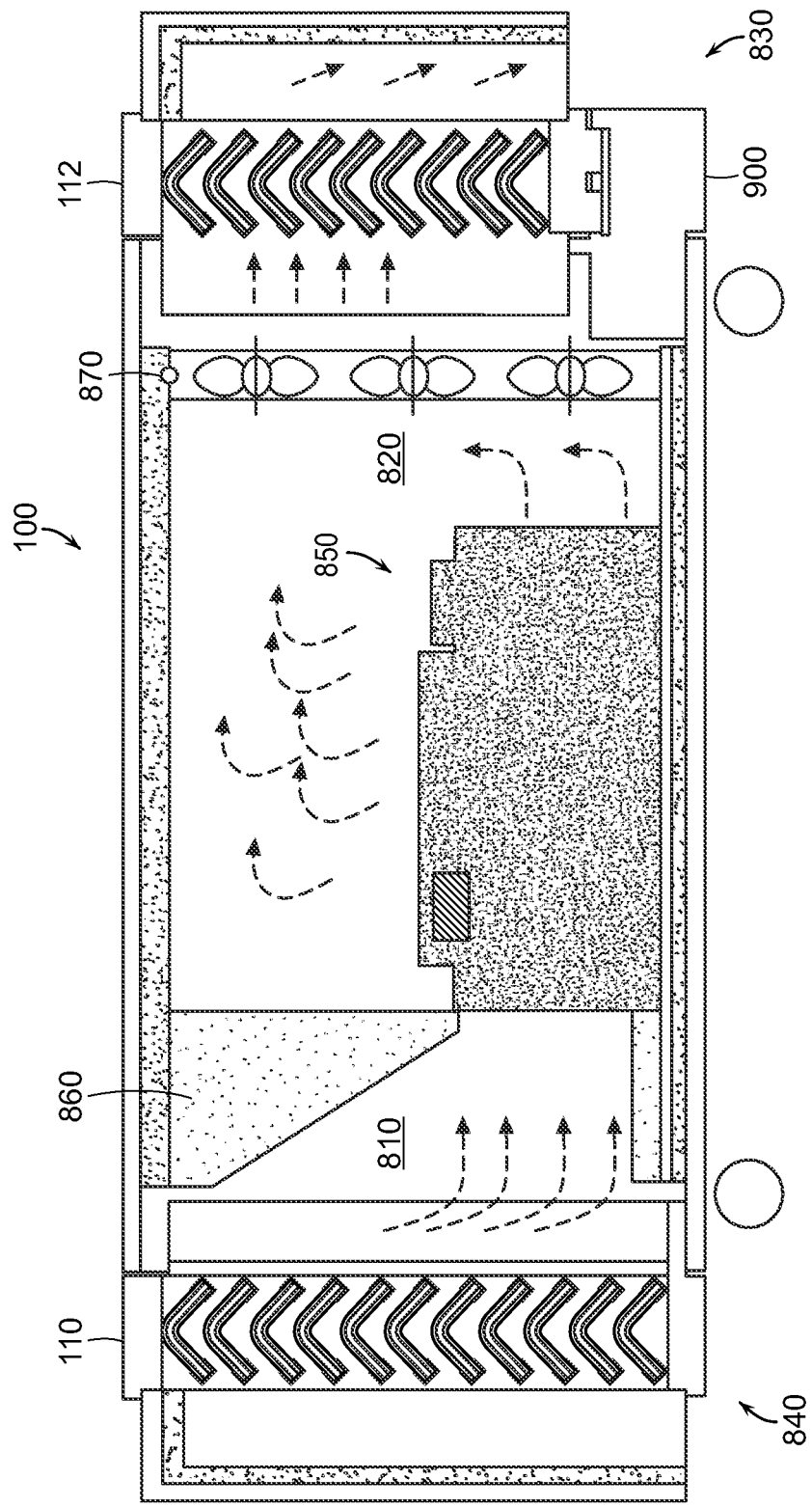

FIG. 8B shows the cut-away side view of FIG. 7 with electronic equipment installed in the enclosure in accordance with an embodiment of the present invention.

Figure 9:
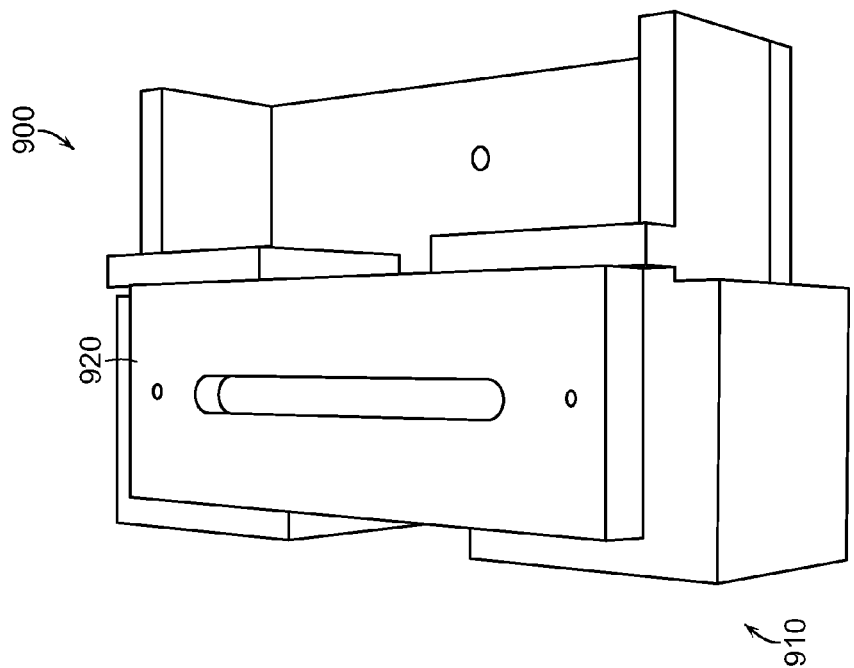

FIG. 9 shows an assembled cable port for attachment to the main body of an enclosure in accordance with an embodiment of the present invention.

Figure 10:
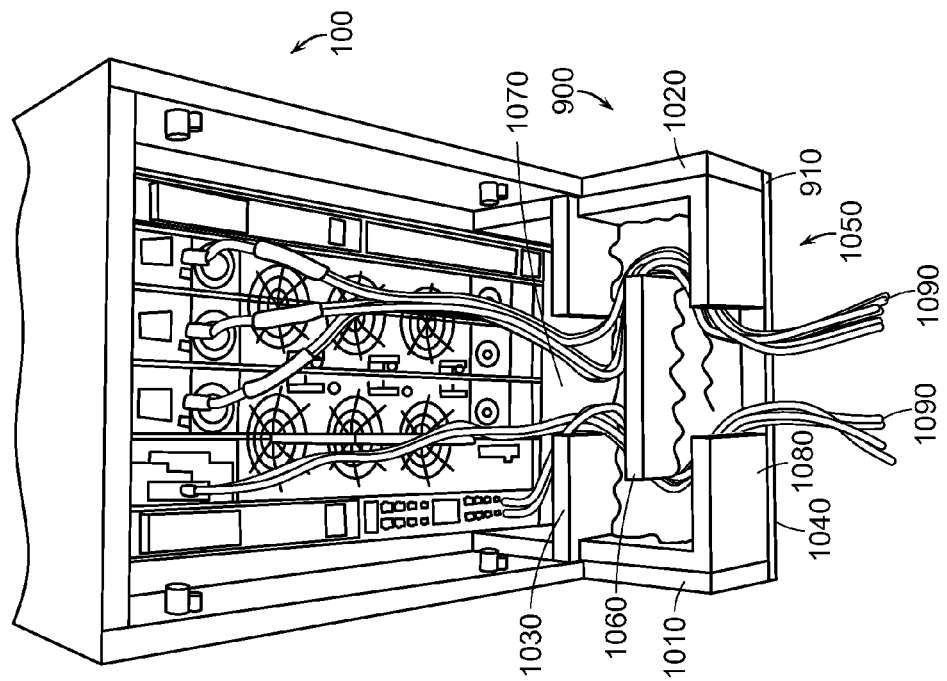

FIG. 10 shows a cable port attached to the main body of an enclosure illustrating cable installation in accordance with an embodiment of the present invention.

Figure 11:
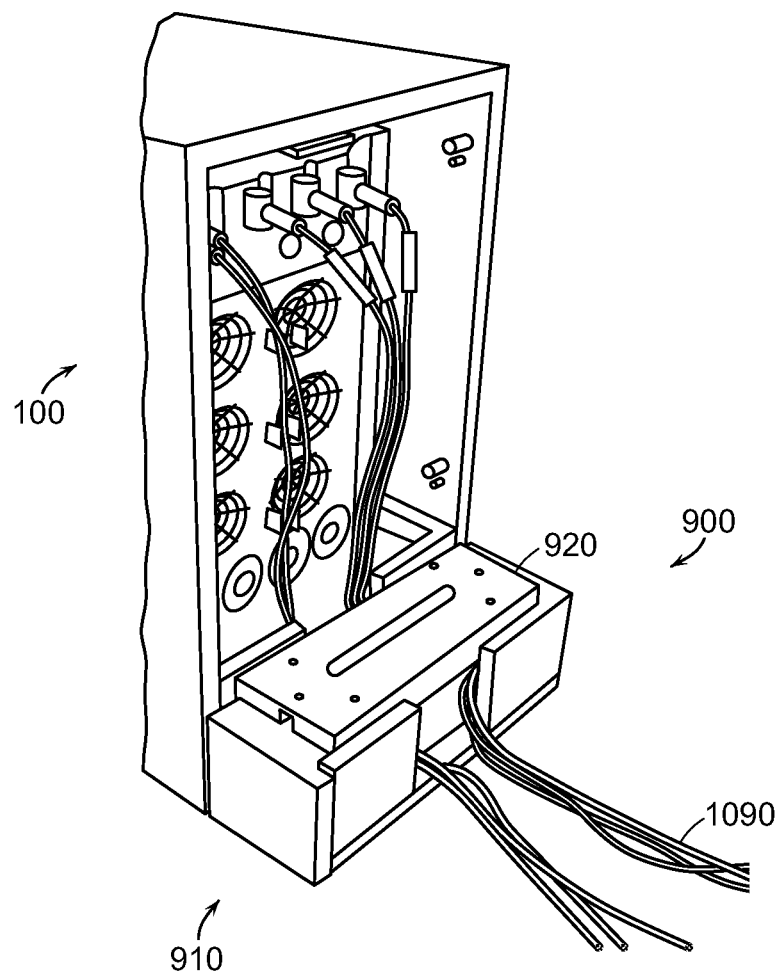

FIG. 11 shows the cable port of FIG. 10 with a lid portion installed in accordance with an embodiment of the present invention.

Figure 12B:
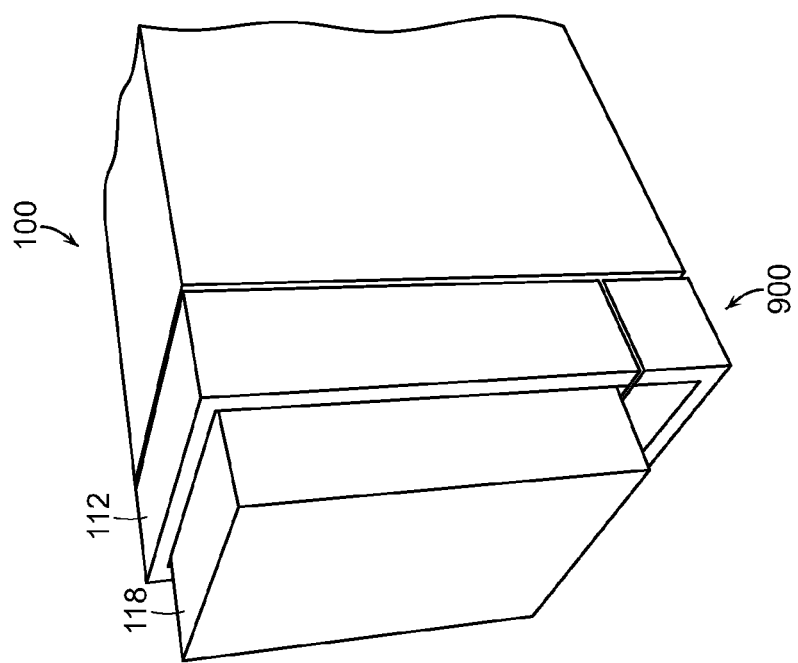
Figure 12A:
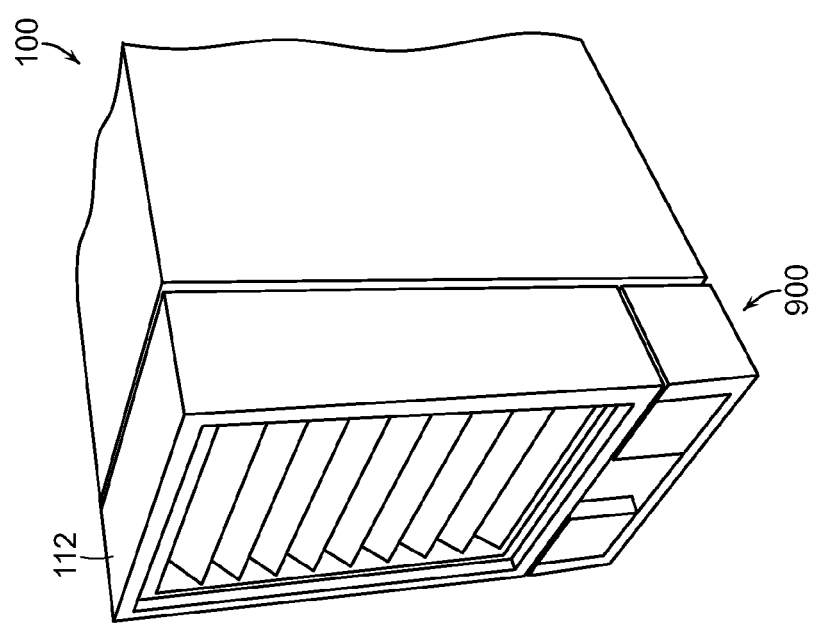

FIGS. 12A-B show a rear perspective view of an exhaust baffle assembly installed on the main body with an optional exhaust chamber cover installed in accordance with an embodiment of the present invention.

Figure 13:
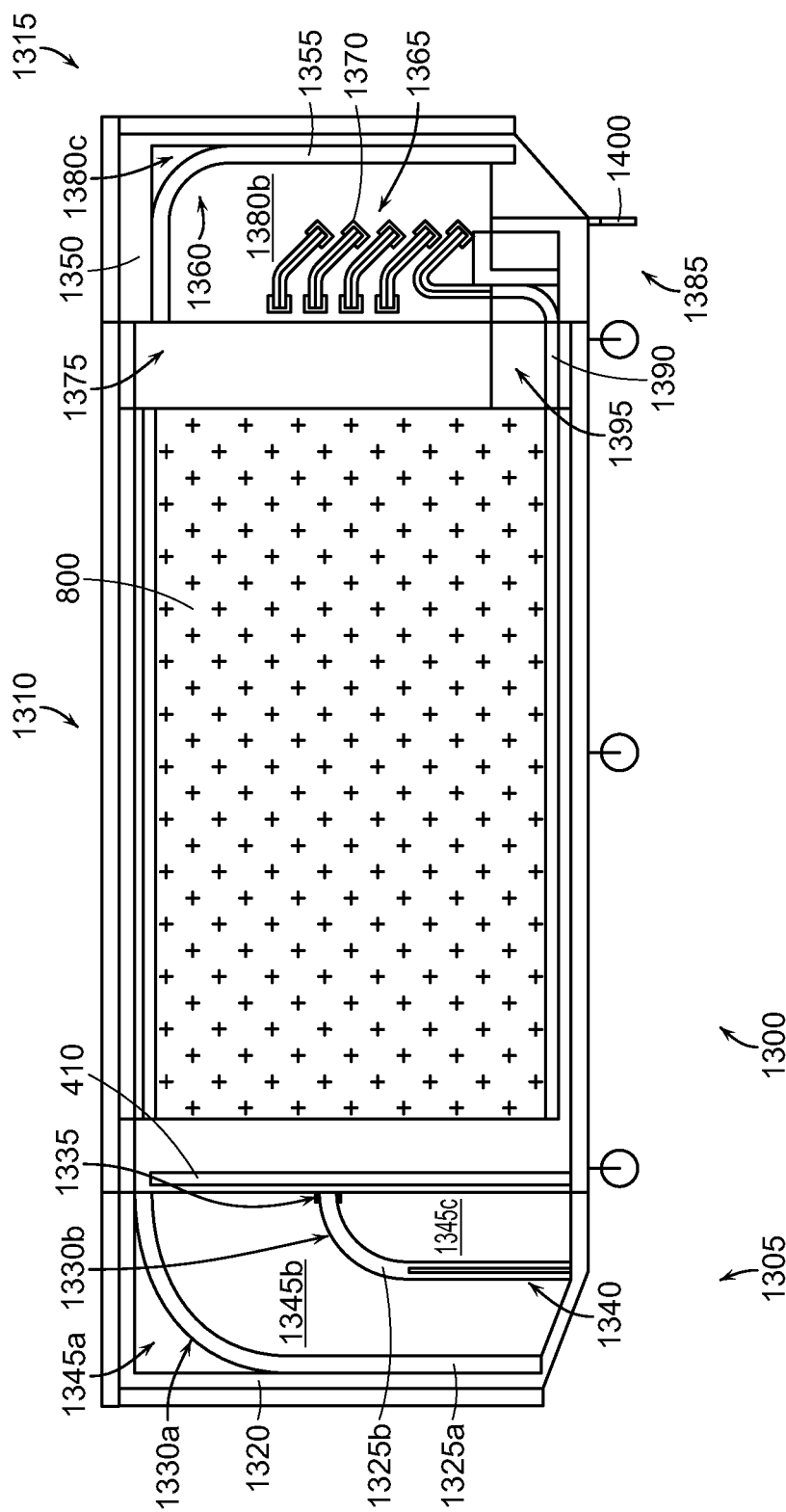

FIG. 13 shows a cut-away side view of an enclosure in accordance with an embodiment of the present invention.

DETAILED DESCRIPTION OF THE INVENTION

The present invention is directed to systems and methods for enclosing electronic equipment in a noise-reducing sleeve that permits air to flow into and out of the enclosure. One embodiment of the invention lacks an air moving device, but, rather, relies on fans present in electronic equipment placed into the enclosure for exchange of air. The enclosure of the present invention provides for ingressing air into an enclosure through an ingress baffle arrangement and egressing air from the enclosure through an egress baffle arrangement. The baffle arrangements are constructed of resilient materials that are deformed into a configuration that prevents a line of sight through the baffle structure. The resilient materials have noise-absorbing properties. It is within the scope of the present invention that embodiments can have an intake chamber into which cooling air enters before passing though the ingress baffle arrangement and into the enclosure. Likewise, in some implementations, an exhaust chamber is provided into which air exiting the egress baffle arrangement enters. The optional intake and exhaust chambers also aid in reducing the amount of noise that escapes the enclosure. It is also within the scope of the present invention that embodiments of the present invention can use a cable egress port that allows cables and wiring to pass through the egress port while blocking the transmission of noise through the egress port.

Figure 1:
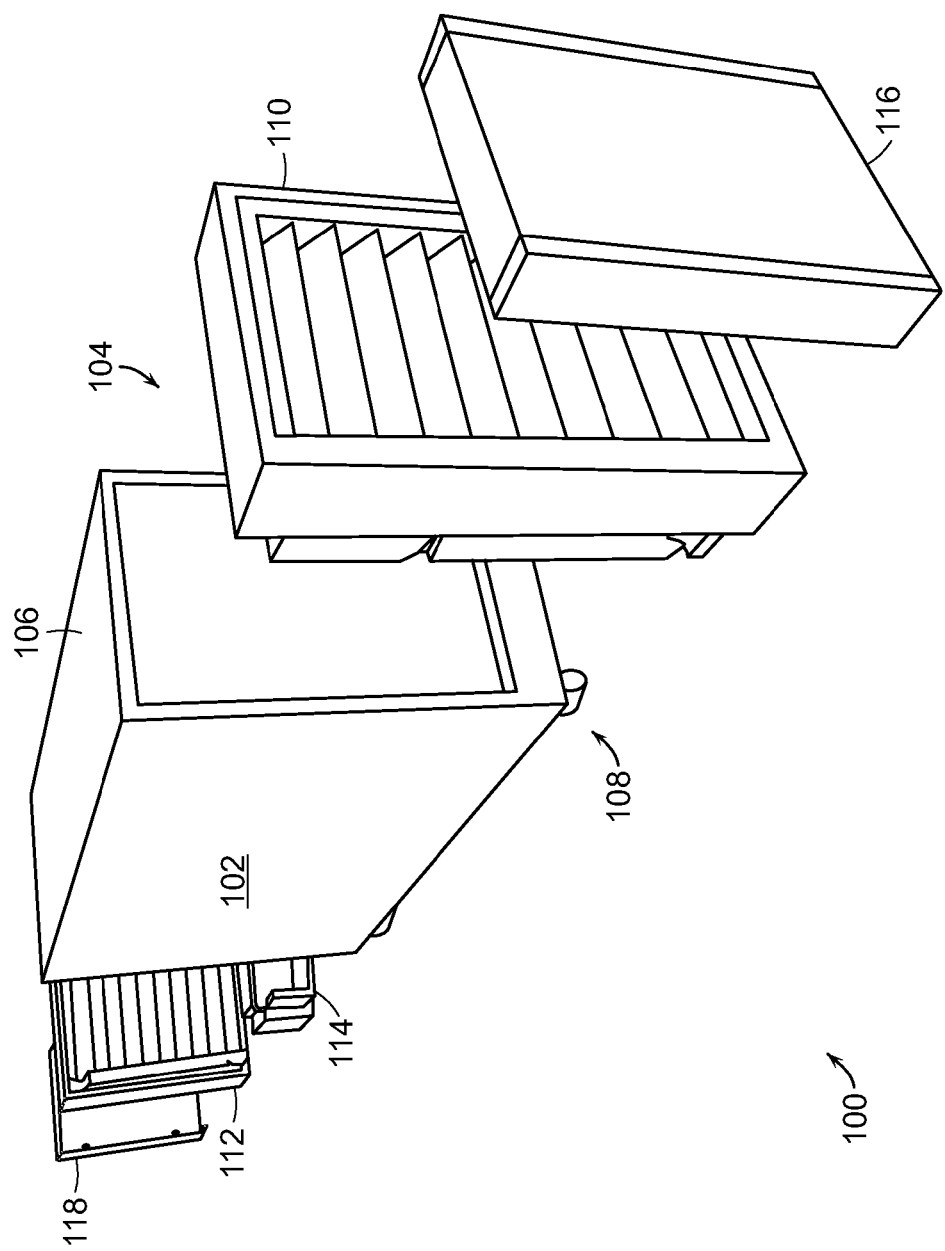
FIG. 1 shows an exploded perspective view of an enclosure having features in accordance with an embodiment of the present invention.

FIG. 1, generally at 100, shows an embodiment of the present invention. Enclosure 100 has a main body that is generally box-shaped, having four sides, including a left side 102, a right side 104 (hidden from view), a top side 106, and a bottom side 108 (hidden from view). Enclosure 100 can be sized to receive various types of electronic equipment. In one implementation, the internal dimensions of enclosure 100 are such that an HP BladeSystem c3000 Enclosure fits snuggly within enclosure 100. Enclosure 100 can be constructed of various materials, for example, wood, metal, or medium density fiberboard covered with a wood, plastic, or metal laminate. In the embodiment, portions of the inside walls of enclosure 100 may be coated with materials that have noise-absorbing or noise-abating properties. One set of materials useful for this purpose includes the ACOUSTIML™ multi-layer soundproofing material (commercially available from Acousti Products, LTD of Chesham, U.K.). Specifically, the 6.9 mm, 12 mm and/or 13 mm 3-layer acoustic composite materials by that manufacturer are suitable for use in embodiments of the present invention. This 3-layer material is constructed of a rubber-like acoustic barrier sandwiched between two layers of acoustic foam. By suspending the dense acoustic barrier layer between two foam layers, the material exhibits high sound transmission loss values and enhanced low frequency absorption performance.

Other examples of materials useful for this purpose include anti-resonant polymeric damping materials (for absorbing vibration) and/or polyurethane foam (such as that sold commercially as PYROSORB Flame Resistant Acoustic Foam). The polyurethane foam can be either flat foam (e.g., foam of 10 mm or 25 mm uniform thickness) or "egg box" foam. Examples of anti-resonant polymeric damping materials include TS3 1.8 mm thick chlorinated polyethylene (CPE) flexible polymeric damping sheet used in the automotive industry. The damping sheet may have adhesive backing to increase the ease of application. Further examples include one or a combination of polymer foams, fiberglass, carpet, and other anti-resonance sheet materials. Coating portions of the inside walls of enclosure 100 with anti-resonant materials helps to reduce the amount of noise transmitted to the walls of enclosure 100, thereby reducing the amount of noise passed to the outside of enclosure 100 by the walls.

Electronic equipment (not shown) can be disposed in enclosure 100 and can rest on bottom side 108. Enclosure 100 has an intake baffle arrangement 110, which attaches to the front of enclosure 100, and an exhaust baffle arrangement 112, which attaches to the rear of enclosure 100. Intake baffle arrangement 110 and exhaust baffle arrangement 112 may be removably connected to enclosure 100 in such a manner that air will enter enclosure 100 by way of intake baffle arrangement 110 and exit via exhaust baffle arrangement 112 through the operation of cooling fans included in the electronic equipment disposed within enclosure 100. Intake baffle arrangement and exhaust baffle arrangement may be connect to enclosure 100 by a pin and groove mechanism discussed in more detail below.

Enclosure 100 can be implemented with a cable port 114, which permits cables to enter enclosure without a significant disruption of the noise-abating characteristics of the enclosure. Cable port 114 is described in greater detail below. Enclosure 100 also, optionally, includes an intake chamber cover 116 that cooperates with intake baffle arrangement 110 to form an intake chamber. Likewise, enclosure 100 can include an exhaust chamber cover 118 that cooperates with exhaust baffle arrangement 112 to form an exhaust chamber. Theses features are described in more details below.

Figure 2:
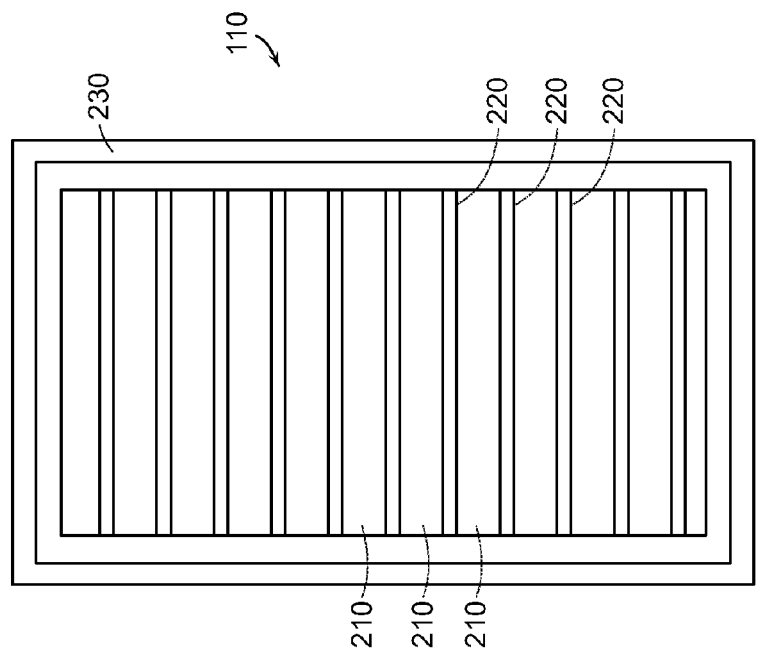
FIG. 2 shows a front view of an enclosure having features in accordance with an embodiment of the present invention.

FIG. 2 shows a front view of enclosure 100 with intake baffle arrangement 110 installed in an operating configuration. Intake baffle arrangement 110 has a plurality of spaced-apart baffles 210. The spaces between baffles 210 form a plurality of vents 220. Vents 220 permit air outside enclosure 100 to pass between baffles 210 and into enclosure 100. Meanwhile, although air can pass between baffles 210, through vents 220, baffles 210 have a shape that prevents a line-of-sight through intake baffle arrangement 110. Intake baffle arrangement 110 has a four-sided frame structure 230 that cooperates with the individual baffles 210 to define the particular baffle shape, as described in more detail below. Intake baffle arrangement 110 can be constructed out of the same materials as generally set forth above for enclosure 100.

Figure 3:
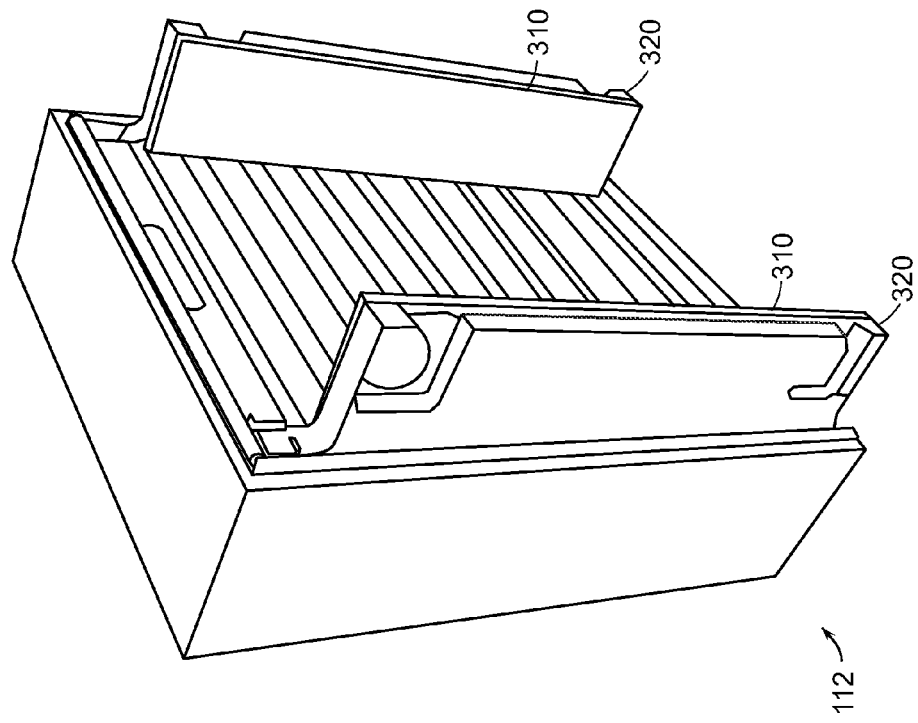
FIG. 3 shows a perspective view of an exhaust baffle assembly in accordance with an embodiment of the present invention.

FIG. 3 shows a perspective view of exhaust baffle arrangement 112 removed from the main body of enclosure 100. Exhaust baffle arrangement 112 has features that are similar to intake baffle arrangement 110. Namely, exhaust baffle arrangement 112 also has a plurality of vents with corresponding vents in-between. Exhaust baffle arrangement 112 has two mounting arms 310 that fit to a rear portion of the main body of enclosure 100. Each mounting arm has a top and bottom groove 320 each of which mates with a complimentary pin (not shown) inside the main body of enclosure 100. Thus, the groove and pin mounting mechanism provides for removal and replacement of exhaust baffle arrangement 112 without the use of tools. Optionally, exhaust baffle arrangement 112 may be fixedly joined to enclosure 100. Intake baffle arrangement 110 may also be fitted with a locking mechanism to prevent undesired removal or tampering with the electronic equipment inside enclosure 100. Intake baffle arrangement 110 has similar features enabling it to be mounted to a front portion of the main body of enclosure 100.

FIGS. 4A-C show a series of perspective views of intake baffle arrangement 110 with an optional filtering device 410 installed. Filtering device 410 slides into grooves in mounting arms 420 and is held adjacent to baffles 210. Thus, filtering device 410 is disposed between baffles 210 and the interior of enclosure 100. Filtering device 410 is constructed of filtering material known to those having skill in the art and prevents dirt, dust, and other particular contaminates from entering enclosure 100 and, thereby, enhances the life of the equipment inside. Filtering device 410 is readily removable for cleaning or replacement.

FIG. 5 shows a cut-away perspective view of the main body of enclosure 100, intake baffle arrangement 110, and exhaust baffle arrangement 112. The figure illustrates how the baffle arrangements enable air to flow into enclosure 100 (represented by arrow 510) and out of enclosure 100 (represented by arrow 520) while reducing the amount of noise that escapes enclosure 100 (represented by arrows 530).

FIG. 6A shows a cross-sectional side view of intake baffle arrangement 110. As mentioned above, intake baffle arrangement 110 has multiple baffles 210 spaced-apart to create multiple vents 220. The cross-sectional area of vents 220 is selected to permit sufficient airflow through enclosure 100, as required by the particular application. In the embodiment described, 30% of the total cross-sectional area bounded by the frame of intake baffle arrangement is open to airflow (shown as 605). Greater and lesser amounts of open area are within the scope of the invention.

Meanwhile, the shape and arrangement of baffles 210 prevent a line-of-sight from the outside of enclosure 100 (shown as 610) to the inside of enclosure 100 (shown as 620). Specifically, in the embodiment shown in the figure, a lowest-most portion 630 of one baffle overlaps vertically with the upper-most portion 640 of another baffle. Thus, every noise path (shown as 650a-c) from the inside of enclosure to the outside of the enclosure will include one or more reflections off of baffles 210. Because baffles 210 are constructed of noise-abating material, some amount of sound energy is absorbed with each reflection. Therefore, the volume of any noise escaping enclosure 100 is reduced. Some noise paths are completely prevented from escaping enclosure 100 (shown as noise path 650c).

Baffles 210 are constructed from a multi-layered resilient material, which absorbs some of the sound energy of noise attempting to escape from enclosure 100. In addition, because the material is resilient, vibrations that could otherwise be induced in, or transmitted by, rigid baffle materials is reduced. In one illustrative example, the baffle material is the 3-layer ACOUSTIML™ material described above. This multi-layer "sandwich" is substantially flat in a relaxed state.

In one implementation, the baffles are formed from four strips of the 3-layer acoustic composite material, as shown in FIG. 6B, essentially creating a double-thick layer of 3-layer acoustic composite material. FIG. 6B also illustrates a cross-sectional view of the 3-layer acoustic composite material. A first layer of acoustic foam 690a is joined to a dense acoustic barrier material 690b, which is then joined to a second layer of acoustic foam 690c. A main strip of this composite material 670a is joined to three other strips—a leading edge strip 670b, a middle strip 670c, and a trailing edge strip 670d. A gap 680a between leading edge strip 670b and middle strip 670c and a gap 680b between middle strip 670c and trailing edge strip 670d provide increased flexibility to the multi-layer composite baffle that allows the assembled rectangular strips to deform more easily, as described below. The size of gaps 680a-b and the number of gaps can vary depending upon the desired shape of the deformed baffle. Likewise, gaps 680a-b can be eliminated and remain within the scope of the invention.

The assembled rectangular strips of the resilient material are deformed into substantially "V-shaped" baffles by engaging each long edge of the rectangle with support members that are separated by a distance that is less than the short edge of the rectangle. FIGS. 6A-B illustrate one such implementation. Support members 660 engage the opposing long edges of rectangular strips of material that form one of baffles 210 (a single support member 660 is shown in FIG. 5 for illustrative purposes only). Because the distance between support members 660 is less than the short edge of the rectangular strip of baffle material, the baffle material is deformed into the substantially V-shaped baffle mentioned above. Support members 660 can be constructed of metal, plastic, wood, or other suitable materials that can maintain the resilient material in the desired deformed shape. Support members 660 can be mounted inside circular cutouts 665 in the inside wall of intake baffle arrangement 110, which provide support and control the distance between support members 660. Support members 660 may also be joined to the frame of intake baffle arrangement by gluing, welding, mechanical fasteners, and other known methods.

The arms of the V-shaped baffles shown in FIGS. 6A-B are of roughly equal length and are at an approximately 88-degree angle to each other (i.e., each support member 660 is at 44-degrees relative to the horizontal). However, greater and lesser angles may be used and remain within the scope of the invention. In addition, other cross-sectional shapes are contemplated, such as U-shapes, non-uniform curved shapes, and linear shapes. For example, the resilient material may be allowed to remain in its relaxed state (i.e., substantially flat), and mounted in relation to other substantially flat baffles to prevent a line of sight between the inside and outside of the enclosure.

FIG. 7 shows a cut-away side view of enclosure 100. As mentioned above, portions of the inside walls of enclosure 100 may be coated with noise-abating material(s). As shown in the figure, top side 106 has a noise-abating material 710 disposed thereon. Meanwhile, bottom side 108 also has a noise-abating material 720 disposed on the inner surface thereof. A floor member 730 is disposed on top of noise-abating material 720 to support the electronic equipment placed inside enclosure 100. Floor 730 protects noise-abating material 720 from damage by installation and/or removal of equipment from enclosure 100. Although not shown, noise-abating material can be disposed on left side 102 and right side 104. The noise-abating materials disposed on the inner walls of enclosure 100 reduce the amount of noise that is absorbed and re-radiated by the walls of the enclosure. The noise-abating material employed herein can be any one or combination of the materials mentioned above. However, it is intended that other materials that suppress low frequency noise generated by the electronics inside enclosure 100 and prevent the noise from passing through the structure of the enclosure may be used for noise-abating material.

Noise-abating material may also be disposed on one or more inside walls of intake chamber cover 116 and exhaust chamber cover 118. As mentioned above, intake chamber cover 116 cooperates with intake baffle arrangement 110 to form an intake chamber 740. This chamber reduces the amount of noise perceived outside of enclosure 100 by directing escaping sound toward noise-abating material 750 and then downward through an intake chamber inlet 760 toward the ground. Meanwhile, exhaust chamber cover 118 cooperates with exhaust baffle arrangement 112 to form exhaust chamber 770. Noise-abating material 780 and exhaust chamber outlet 790 also reduce the amount of noise perceived from enclosure 100. FIG. 7 shows noise-abating material covering the entire surface of the inside walls of enclosure 100. However, it is also contemplated that the noise-abating materials cover only a portion of the walls and still obtain a desired noise abatement effect.

FIG. 8A shows the cut-away side view of FIG. 7 with electronic equipment 800 installed in enclosure 100. As disclosed above, electronic equipment 800 fits snuggly into enclosure 100 so that the outer surface of electronic equipment 800 is in contact with the noise-abating material disposed on the inner surface of the walls of enclosure 100. Such an arrangement creates an intake plenum 810 between intake baffle arrangement 110 and electronic equipment 800 and an exhaust plenum 820 between the equipment and exhaust baffle arrangement 112. Because electronic equipment 800 fits snuggly inside enclosure 100, intake plenum 810 and exhaust plenum 820 are substantially sealed from one another. Thus, air exiting electronic equipment 800 is forced outside enclosure 100 through the exhaust assembly (generally, 830), while fresh air (i.e., relatively cooler air) is drawn into enclosure through the intake assembly (generally, 840). In this way, relatively hotter air leaving electronic equipment is not recycled into the intake plenum, which aids in cooling the equipment.

By fitting snuggly inside enclosure 100, electronic equipment 800 is essentially suspended in noise-abating material. As describe above, this material is constructed of multiple layers. At the core of the multiple layers is a dense acoustic barrier material. The acoustic barrier material is bounded on each side with an acoustic foam material. The amount of vibration energy generated by electronic equipment 800 that is transmitted to the walls of enclosure 100 is greatly reduced by the described arrangement. The multi-layered material holds the equipment firmly in place inside enclosure 100, however, because no rigid connection exists between electronic equipment 800 and the walls of enclosure 100, very little vibration energy reaches the walls, from which it would be radiated as noise.

Although the embodiment set forth above describes the electronic equipment as fitting snuggly within enclosure 100, other implementations do not require such a snug fit. FIG. 8B illustrates an alternate implementation of the embodiment designed to house electronic equipment 850 that is smaller than the inner dimension of enclosure 100. One or more internal walls 860 can be added to maintain intake plenum 810 and exhaust plenum 820 substantially sealed from one another. Theses internal walls can be constructed of rigid or flexible materials, so long as the only significant air path between the plenums is through the equipment. In addition, an optional air-moving device 870 (e.g., a bank of fans) can be added to assist in the removal of warm air from exhaust plenum 820. However, depending on the particular electronic equipment disposed within enclosure 100, the fans present in the equipment may be sufficient to exhaust air from enclosure 100.

FIG. 9 shows an assembled cable port 900 for attachment to the main body of enclosure 100. Cable port 900 has a cable port body 910 that attaches to the main body of enclosure 100 adjacent to exhaust baffle arrangement 112. Cable port 900 also includes a cable port cover 920 that mates with cable port body 910 to form a noise-abating seal that permits cables to pass into enclosure 100 from the outside. In certain implementations, cable port 900 cooperates with exhaust baffle arrangement 112 to seal the exhaust assembly (830 of FIG. 8A) to the main body of enclosure 100.

FIG. 10 shows cable port 900 attached to the main body of enclosure 100 with cable port cover 920 removed to illustrate cable installation. Cable port 900 can be joined to bottom side 108 (hidden from view) of enclosure 100 by various methods such that cable port 900 is removable or solidly attached. For example, cable port 900 can be joined to bottom side 108 of enclosure 100 by nuts and bolts, screws, or other fasteners, or, cable port 900 can be joined by welding, soldering, or gluing.

Cable port 900 has a generally box-shaped structure including left 1010, right 1020, front 1030, and rear 1040 upright sides. Cable port 900 also as a bottom side 1050 and a cable port baffle 1060. Front upright side 1030 and rear upright side 1040 each have an opening that permits cables to pass through (1070 and 1080, respectively). Cable port baffle 1060 is disposed within cable port 900 and is sufficiently wide to prevent a line-of-sight between openings 1070 and 1080. With cable port cover 920 removed, cables 1090 can be placed through opening 1070 in front upright side 1030, around cable port baffle 1060, and through rear upright side 1080 without the need to thread cables 1090 through any openings. This advantageously allows for placement of cables 1090 having large end connectors without the need to first remove the connectors and replace the connectors once cables 1090 are in position. Likewise, cables 1090 can be easy removed from cable port 900 without having to modify end connectors present on cables 1090.

Any one or more of the five sides of cable port 900 can be constructed of materials similar to those used for the walls of enclosure 100 described above. Likewise, the inside surfaces of the sides of cable port 900 can be treated or covered with materials that have noise-absorbing properties similar to those mentioned above. In the example embodiment, the inside surface of the bottom side 1050 of cable port 900 is covered with 10 and/or 25 mm thick egg box style polyurethane foam. Although not shown, egg box style polyurethane foam is also placed on the underside of cable port cover 920 such that when cover 920 is secured in its place, the polyurethane foam layers on cover 920 and bottom side 1050 have complimentary shapes. When pressed together, the egg box foam layers form a noise-absorbing seal around cables 1090. Optionally, small vertical slits can be made in the polyurethane foam on cable port cover 920 (not shown) to facilitate sealing around cables 1090.

FIG. 11 shows cable port 900 of FIG. 10 with cable port cover 920 installed on cable port body 910. As shown in the figure, cables 1090 pass through cable port and into enclosure 100, while the noise-abating material disposed on the inner surfaces of cable port body 910 and cable port cover 920 cooperate to reduce the amount of noise that escapes enclosure 100.

FIGS. 12A-B show a rear perspective view of exhaust baffle arrangement 112 installed on the main body of enclosure 100 with optional exhaust chamber cover 118 installed. Also illustrated is cable port 900. As shown in the figure, exhaust baffle arrangement 112 and cable port 900 cooperate to substantially seal the rear portion of the main body of enclosure 100. Moreover, exhaust baffle arrangement 112 and cable port 900 are disposed relative to each other such that exhaust baffle arrangement 112 can be removed and replaced on enclosure 100 without affecting the placement of cables passing through cable port 900.

FIG. 13 shows a cut-away side view of an enclosure 1300 in accordance with an embodiment of the present invention. Enclosure 1300 has some similar features to those described above in connection with enclosure 100. However, the design of the baffle arrangements, internal airflow characteristics, and cable port differ from enclosure 100. Specifically, enclosure 1300 is constructed of the same materials as those described above, and enclosure 1300 has an intake chamber cover 1305, a main body 1310, and an exhaust chamber cover 1315. As with the previous embodiment, electronic equipment 800 fits snuggly into the enclosure so that the outer surface of electronic equipment 800 is in contact with noise-abating material disposed on the inner surface of the walls of enclosure 1300. Optional filtering device 410 can also be installed as described in greater detail above.

Intake chamber cover 1305 is lined with noise-abating material 1320 and contains two curved baffles 1325a and 1325b, which are constructed of the ACOUSTIML™ material described above. Like the other baffle structures described above, curved baffles 1325a-b can be constructed of other types of noise-abating material. Curved baffle 1325a is attached to the noise-abating material lining the inside of intake chamber cover 1305 along the bottom portion of the baffle and at the top end of the baffle. This feature maintains a curved portion 1330a of baffle 1325a that is not rigidly anchored within the intake chamber. As described above, because the baffle material is resilient, vibrations that could otherwise be induced in, or transmitted by, rigid baffle materials are reduced. Moreover, the curved shape is believed to aid in smooth airflow into main body 1310 of the enclosure.

Curved baffle 1325b is anchored at its top end by a support member 1335, which functions as support member 660 described above. The bottom portion of curved baffle 1325b is affixed to an anchor 1340. Anchor 1340 can be a rigid panel that extends across a portion of the intake chamber, and can be made, for example, from medium-density fiberboard. The walls of intake chamber cover 1305, the noise-abating material lining thereof, and curved baffles 1325a-b define three spaces within the intake chamber. Airspace 1345a is defined by the noise-abating material liner and curved baffle 1325a; this airspace provides an additional noise-abating measure by reducing the amount of sound energy that is transmitted to the walls of the intake chamber cover. Airspace 1345b is defined by curved baffles 1325*a* and 1325*b* and provides a smooth airflow path for air entering enclosure 1300 while also permitting any sound energy escaping main body 1310 to reflect off of curved baffles 1325*a-b*, thereby reducing the volume of the noise caused thereby. Airspace 1345*c* is defined by curved baffle 1325*b* and filtering device 410 (or the walls of main body 1310 if filtering device 410 is not installed). Airspace 1345*c* also provides a smooth airflow path for incoming air and noise-abating properties. Additional curved baffles, and the airspaces defined thereby, are within the scope of the invention.

Exhaust chamber cover 1315 is lined with noise abating-material 1350 and also has a curved baffle 1355. Curved baffle 1355 is attached to the noise-abating material lining the inside of exhaust chamber cover 1315 along the bottom portion of the baffle and at the top end of the baffle. This feature maintains a curved portion 1360 of baffle 1355 that is not rigidly anchored within the exhaust chamber. As described above, because the baffle material is resilient, vibrations that could otherwise be induced in, or transmitted by, rigid baffle materials are reduced. Moreover, the curved shape is believed to aid in smooth airflow out of main body 1310 of the enclosure, thereby reducing the likelihood of the creation of pockets of trapped air. This further reduces the likelihood of the formation of "hot spots" within the enclosure.

Exhaust chamber cover 1315 includes a baffle arrangement 1365. The baffles of this arrangement can be constructed in the same manner described above for the baffles of baffle arrangement 110. Specifically, the baffles are constructed of one or more strips of the multi-layer acoustic composite material. Also, the baffles can be held in place, and maintained in a desired shape, by support members 1370 similar to support members 660. Thus, as those described above, baffle arrangement 1365 provides gaps between the baffles that permit air to flow through the baffles while enabling escaping noise to be abated. As with the other baffle arrangements described herein, the long edges of the baffles are held in place such that the portion in-between the long edges is maintained in a resilient state.

As is shown in FIG. 13, the baffles of baffle arrangement 1365 need not extend the entire height of the exhaust chamber. Rather, a relatively large gap 1375 can be maintained above the top-most baffle and below the top edge of curved baffle 1355. This feature provides for uninterrupted airflow along the top of the inside of main body 1310, into the exhaust chamber, and along curved baffle 1355, thereby reducing the likelihood of the creation of pockets of trapped air and the hot spots associated therewith. While the figure shows the baffles disposed along slightly more than half of the height of the exhaust chamber, the baffles can extend along the entire height or any portion of the height of the chamber. Likewise, the number of baffles can differ from the number shown in the figure.

Baffle arrangement 1365, curved baffle 1355, and noise-abating material 1350 cooperate to define two airspaces 1380*a* and 1380*b*. Airspace 1380*a* is defined by noise-abating material 1350 and curved baffle 1355; this airspace provides an additional noise-abating measure by reducing the amount of sound energy that is transmitted to the walls of the exhaust chamber cover. Airspace 1380*b* is defined by curved baffle 1355 and baffle arrangement 1365 and provides a smooth airflow path for air exiting enclosure 1300 while also permitting any sound energy escaping main body 1310 to reflect off of curved baffle 1355 and/or baffle arrangement 1365, thereby reducing the volume of the noise perceived.

Enclosure 1300 includes a cable port 1385, which has many of the features of cable port 900, described above. Specifically, cable port 1385 is generally boxed-shaped, is lined with noise-abating material, includes a cable port cover, has openings to permit cables to pass therethrough, and has at least one baffle to prevent a line-of-sight through the cable port. Relative to cable port 900, in view of the entire enclosure, cable port 1385 is shorter than cable port 900 (with length extending left-to-right in the figure). Moreover, cable port 1385 is disposed further away from the back of electronic equipment 800 than the earlier described embodiment. In addition, a portion of a curved baffle 1390 is affixed to the floor of the closure, while the other end of the baffle is attached to, or rests against, cable port 1385. This curved baffle 1390 and the increased clearance relative to the back of electronic equipment 800 reduces the likelihood of trapping air in space 1395, thereby reducing heat retained inside the enclosure.

Enclosure 1300 includes a backwash preventer 1400 mounted on a lower portion of exhaust chamber cover 1315 inboard from the exhaust chamber outlet. In one implementation, backwash preventer 1400 is a brush-strip that extends along the width of enclosure 1300 (the width extending out of the page). Backwash preventer 1400 reduces the amount of hot exhaust air that passes under enclosure 1300 and reenters through the intake chamber inlet. While greatly reducing or preventing the passage of air, the brush-strip remains flexible enough permit the enclosure to be moved without causing damage to backwash preventer 1400. Also, the flexibility of the brush-strip assists in maintaining a seal against possible irregular surfaces upon which enclosure 1300 may rest. Backwash preventer 1400 may be removable or fixedly attached and can be located elsewhere on the bottom of enclosure 1300.

The terms and expressions that are employed herein are terms of description and not of limitation. There is no intention in the use of such terms and expressions of excluding the equivalents of the feature shown or described, or portions thereof, it being recognized that various modifications are possible within the scope of the invention as claimed. Moreover, optional features and multiple embodiments are described herein. It is understood that the features of one particular embodiment can be employed in other embodiments and remain within the scope of the invention.

What is claimed is:

1. A housing for abating noise generated from within the housing, the housing comprising: a housing structure defining an internal chamber, an air ingress opening, and an air egress opening, the housing structure configured to cooperate with electronic equipment disposed therein to define an intake plenum and an exhaust plenum within the internal chamber; and the air ingress opening and the air egress opening including a baffle structure comprising a plurality of baffles, the baffles comprising a resilient material defining a plurality of openings in fluid communication with the internal chamber and a space outside the housing structure, at least one of the plurality of baffles having a substantially flat rectangular profile in a relaxed state and mounted in the housing in a deformed state having a curved profile; wherein air outside the housing structure passes sequentially through the air ingress opening into the intake plenum, through the electronic equipment, into the exhaust plenum, and exits the housing structure through the egress opening in the housing structure; wherein the at least one of the plurality of baffles having a substantially flat rectangular profile in a relaxed state is comprised of multiple layers of noise-abating material with at least one outer layer having at least one gap to facilitate deformation of the at least one of the plurality of baffles for mounting in the housing.

2. The housing of claim 1, the baffles being disposed to prevent a line of sight between the inside of the housing structure and the outside of the housing structure while maintaining open vent channels between the baffles.

3. The housing of claim 1, further comprising an air moving device for moving air from inside the housing structure external to the housing structure.

4. The housing of claim 1, the housing structure including a divider disposed in the internal chamber that cooperates with the electronic equipment therein to define the intake plenum and exhaust plenum.

5. The housing of claim 1, the housing structure further comprising a top wall, a first side wall, a second side wall, and a bottom wall, at least one of said walls having a noise-abating material disposed thereon.

6. The housing of claim 5, the housing structure having a first axis extending from the air ingress opening to the air egress opening and having a second axis perpendicular to the first axis, the housing further comprising an elongate member extending along the second axis, the elongate member disposed below the bottom wall and between the air ingress opening and the air egress opening, the elongate member adapted to engage at least a portion of the bottom wall and a portion of a surface upon which the housing rests such that recycling of air between the egress opening and ingress opening is inhibited.

7. The housing of claim 6, the elongate member comprising a brush-strip.

8. The housing of claim 1, the housing structure further defining a port opening in the housing structure and the housing further comprising a cable egress port, the cable egress port comprising:
 a port structure adapted to be received at the port opening, the port structure defining an open top and having at least one internal surface, noise-abating material being disposed on the at least one internal surface of the port structure;
 a cover, the cover adapted to be removably affixed to the port structure at the open top, and the cover having an internal surface, noise-abating material being disposed on the internal surface of the cover; and
 the noise abating material disposed on the internal surface of the port structure cooperating with the noise abating material disposed on the internal surface of the cover when the cover is affixed to the port structure to substantially seal at least one cable passing through the port structure into the housing structure such that noise emanating from the housing structure is abated from exiting through the port structure.

9. The housing of claim 8, the housing structure having a first axis extending from the air ingress opening to the air egress opening and having a second axis perpendicular to the first axis, the housing further comprising an elongate member extending along the second axis, the elongate member disposed below the bottom wall and in contact with a bottom external surface of the port structure, the elongate member adapted to engage at least a portion of the bottom external surface of the port structure and a portion of a surface upon which the housing rests such that recycling of air between the egress opening and ingress opening is inhibited.

10. The housing of claim 9, the elongate member comprising a brush-strip.

11. The housing of claim 1, further comprising an intake structure having a plurality of walls, the plurality of walls defining:
 an air intake inlet in fluid communication with a space outside the housing structure;
 an intake chamber; and
 an air intake outlet in fluid communication with the air ingress opening, at least one of the plurality of walls having noise-abating material disposed thereon.

12. The housing of claim 11, the noise-abating material including a curved baffle extending between a portion of the air intake inlet and the air intake outlet, the curved baffle cooperating with at least one of the plurality of walls to define a curved airflow path within the intake chamber.

13. The housing of claim 1, further comprising an exhaust structure having a plurality of walls, the plurality of walls defining:
 an air exhaust inlet in fluid communication with the egress opening; an exhaust chamber; and
 an air exhaust outlet in fluid communication with a space outside the housing structure, at least one of the plurality of walls having noise-abating material disposed thereon.

14. The housing of claim 13, the noise-abating material including a curved baffle extending between a portion of the air exhaust inlet and the air exhaust outlet, the curved baffle cooperating with at least one of the plurality of walls to define a curved airflow path within the exhaust chamber.

15. The housing of claim 1, further comprising a filtering device disposed within the air ingress opening.

16. A housing comprising: a housing structure defining an internal chamber, an air ingress opening, and an air egress opening, the housing structure configured to house electronic equipment disposed therein and configured to define an intake plenum and an exhaust plenum within the internal chamber; and the air ingress opening and the air egress opening including a baffle structure comprising a plurality of baffles, the baffles comprising a resilient material defining a plurality of openings in fluid communication with the internal chamber and a space outside the housing structure, at least one of the baffles having a substantially flat rectangular profile in a relaxed state and mounted in the housing in a deformed state having a curved outer surface; wherein the at least one of the plurality of baffles having a substantially flat rectangular profile in a relaxed state is comprised of multiple layers of noise-abating material with at least one outer layer having at least one gap to facilitate deformation of the at least one of the plurality of baffles for mounting in the housing.

17. The housing of claim 16, wherein the at least one of the baffles having a curved outer surface is in contact with at least one of a plurality of walls of the housing to define a curved airflow path.

18. The housing of claim 16, the housing structure further comprising a top wall, a first side wall, a second side wall, and a bottom wall, at least one of said walls having a noise-abating material disposed thereon.

19. The housing of claim 16, the housing structure further defining a port opening in the housing structure and the housing further comprising a cable egress port, the cable egress port comprising:
 a port structure adapted to be received at the port opening, the port structure defining an open top and having at least one internal surface, noise-abating material being disposed on the at least one internal surface of the port structure;
 a cover, the cover adapted to be removably affixed to the port structure at the open top, and the cover having an internal surface, noise-abating material being disposed on the internal surface of the cover; and
 the noise abating material disposed on the internal surface of the port structure cooperating with the noise abating material disposed on the internal surface of the cover when the cover is affixed to the port structure to substantially seal at least one cable passing through the port structure into the housing structure such that noise emanating from the housing structure is abated from exiting through the port structure.

* * * * *